(12) United States Patent
Yeo

(10) Patent No.: US 9,026,886 B1
(45) Date of Patent: *May 5, 2015

(54) METHODS AND SYSTEMS FOR RECONFIGURABLE LDPC DECODERS

(71) Applicant: Marvell International Ltd., Hamilton (BM)

(72) Inventor: Engling Yeo, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 14/167,699

(22) Filed: Jan. 29, 2014

Related U.S. Application Data

(63) Continuation of application No. 13/224,690, filed on Sep. 2, 2011, now Pat. No. 8,650,457.

(60) Provisional application No. 61/379,998, filed on Sep. 3, 2010.

(51) Int. Cl.
*H03M 13/00* (2006.01)
*G06F 11/10* (2006.01)

(52) U.S. Cl.
CPC ..................................... *G06F 11/10* (2013.01)

(58) Field of Classification Search
CPC ............................. H03M 13/09; H04L 1/0061

USPC ................................. 714/758, 757, 780, 801
See application file for complete search history.

(56) References Cited

U.S. PATENT DOCUMENTS

| 5,490,280 | A  | * | 2/1996  | Gupta et al. | 712/23 |
| 5,801,753 | A  | * | 9/1998  | Eyer et al. | 725/50 |
| 8,108,762 | B2 |   | 1/2012  | Liu et al. | |
| 8,161,348 | B2 |   | 4/2012  | Graef | |
| 8,407,567 | B2 |   | 3/2013  | Gunnam | |
| 2010/0260266 | A1 | * | 10/2010 | Gholmieh et al. | 375/240.25 |

* cited by examiner

*Primary Examiner* — Fritz Alphonse

(57) ABSTRACT

The present disclosure includes systems and methods for acquiring a first set of information for a plurality of low density parity check (LDPC)-encoded data symbols, acquiring a second set of information for the plurality of LDPC-encoded data symbols, and selecting a window including a subset of the plurality of LDPC-encoded data symbols. The present disclosure includes acquiring a decoder schedule having information for controlling the decoder, wherein the information in the decoder schedule includes decoding instructions based on a configuration of at least one of the first set of information and the second set of information. The present disclosure further includes determining a likelihood of an error in the window using the decoding instructions in the decoder schedule, and updating the second set of information for selected data symbols of the subset based on the likelihood of an error in the window.

22 Claims, 4 Drawing Sheets

METHODS AND SYSTEMS FOR RECONFIGURABLE LDPC DECODERS

CROSS REFERENCE TO RELATED APPLICATIONS

This patent application is a continuation of prior U.S. patent application Ser. No. 13/224,690, filed Sep. 2, 2011, which claims the benefit of U.S. Provisional Patent Application No. 61/379,998, filed Sep. 3, 2010, each of which are hereby incorporated by reference herein in their entireties.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted as prior art against the present disclosure.

Embodiments of the disclosure generally pertain to systems and methods for processing data. In particular, embodiments of the disclosure pertain to systems and methods for decoding data.

Different decoders can be used to decode data to achieve different results. Recent codes, such as low-density parity check (LDPC) codes, typically rely on iterative decoding. Iterative decoders are a type of decoder in which the decoding task is performed repetitively until stopping criterion are achieved. These stopping criterion can be based on meeting or exceeding a specific degree of certainty or uncertainty in the results of the decoding.

More particularly, an iterative decoder takes information from a channel as input and performs the decoding by iteratively passing messages between computation nodes. The computation nodes represent the symbols within a codeword. The decoder takes the information from the channel, hereinafter referred to as "channel information," which takes into account the particular code structure and passes the channel information to a computation unit. This computation unit then passes information from the computation unit, hereinafter known as "extrinsic information," back to each computation node. The computation nodes then use this extrinsic information together with the channel information to compute new messages to the computation unit. This process occurs repetitively until stopping criterion are satisfied.

The above-described message passing algorithm used by decoders, including LDPC decoders, is stored in the decoder as a matrix, referred to as a "parity-check matrix," which typically defines the relationship between nodes. The columns of the parity check matrix typically define nodes corresponding to the codeword, while the rows of the parity-check matrix define the nodes corresponding to the parity-check bits. To minimize the cycles between nodes, the parity-check matrices are typically low density, or sparse. Decoders parse through the parity-check matrices by scanning through the parity-check matrix row-wise or column-wise.

LDPC decoders may operate for a range of code configurations (i.e., range of codeword lengths, range of code rates and range of sector sizes). For an LDPC decoder to decode different code configurations, it would necessarily have to be pre-loaded with different parity-check matrices, each corresponding to a particular code configuration. In practice, this results in wasted cycles and wasted storage when a user selects only one code configuration from the range of available code configurations.

SUMMARY

Disclosed herein are systems and methods for decoding data, including decoding data based on iterative codes such as low-density parity check codes. In particular, systems and methods are presented for reconfigurable LDPC decoders.

The systems and methods described herein advantageously provide the hardware of an LDPC reconfigurable decoder with specific instructions for decoding an LDPC codeword, without having to store large parity-check matrices, which can take up large amounts of memory, and without having to parse through these large parity-check matrices, which can be time-consuming.

In particular, the systems and methods described herein include providing a decoder with one or more decoding schedules. The decoding schedules provide step-by-step instructions for decoding an LDPC encoded codeword. For a given desired code configuration, a user may generate a corresponding customized decoding schedules in software. The reconfigurable decoder having the customized decoding schedule may be capable of decoding an LDPC codeword having the desired code configuration, and thus not limited by any particular code configuration.

In one aspect, the systems and methods described herein include methods for decoding data. The methods may include acquiring a first set of information for a plurality of low density parity check (LDPC)-encoded data symbols, acquiring a second set of information for the plurality of LDPC-encoded data symbols, and selecting a window including a subset of the plurality of LDPC-encoded data symbols. The methods include acquiring a decoder schedule having information for controlling the decoder, wherein the information in the decoder schedule includes decoding instructions based on a configuration of at least one of the first set of information and the second set of information. The methods further include determining a likelihood of an error in the window using the decoding instructions in the decoder schedule, and updating the second set of information for selected data symbols of the subset based on the likelihood of an error in the window.

In certain embodiments, the information in the decoding schedules includes decoding instructions dictating functions of the decoder on a cycle-by-cycle basis. The decoding schedule may include at least one of controls to enable memory read commands, controls to read memory addresses, controls to enable memory write commands, controls to write to memory addresses, controls to reset processors, controls to reset parity check circuits, controls to enable parity checks, and controls to insert stalls in the processing pipeline. The decoding schedule may include decoder parameters including at least one of code word size and length, range of supported number of parity bits in code, range of supported number of user bits in code, circulant size, number of iterations to decode, number of layers to decode, column weight, and row weight. The decoding instructions may be based on one or more parity-check matrices corresponding to a configuration of at least one of the first set of information and second set of information.

In certain embodiments, the first set of information comprises extrinsic information, and the second set of information comprises channel information. The process of updating the channel information may comprise erasing channel information for the selected data symbols. In such embodiments, the methods may include repeating the steps of selecting a window, determining a likelihood of an error in the window, and updating channel information for selected data symbols of the subset in the window. The repeating may continue until a completion condition is met. The completion condition may include performing the updating on one or more data symbols of the plurality of LDPC-encoded data symbols.

In other aspects, the systems and methods described herein include systems for decoding data. The systems may include a reconfigurable low-density parity check (LDPC) decoder, a receiver, a selection module, a storage module, a determination module and an updating module. In certain embodiments, the reconfigurable low-density parity check (LDPC) decoder acquires a first set of information for a plurality of low density parity check (LDPC)-encoded data symbols. The receiver may acquire a second set of information for the plurality of LDPC-encoded data symbols and the selection module may select a window including a subset of the plurality of LDPC-encoded data symbols. In certain embodiments, the storage module may be configured to acquire a decoder schedule having information for controlling the decoder, wherein the information in the decoder schedule includes decoding instructions based on a configuration of at least one of the first set of information and the second set of information. The determination module may determine likelihood of an error in the window using the decoding instructions in the decoder schedule, and the updating module may update the second set of information for selected data symbols of the subset based on the likelihood of an error in the window.

In certain embodiments, the information in the decoding schedules acquired by the storage module includes decoding instructions dictating functions of the decoder on a cycle-by-cycle basis. The decoding schedule may include at least one of controls to enable memory read commands, controls to read memory addresses, controls to enable memory write commands, controls to write to memory addresses, controls to reset processors, controls to reset parity check circuits and controls to enable parity checks. The decoding schedule may include decoder parameters including at least one of code word size and length, range of supported number of parity bits in code, range of supported number of user bits in code, circulant size, number of iterations to decode, number of layers to decode, column weight, and row weight. The decoding instructions may be based on one or more parity-check matrices corresponding to a configuration of at least one of the first set of information and second set of information.

In certain embodiments, the first set of information acquired by the reconfigurable low-density parity check (LDPC) decoder comprises extrinsic information, and the second set of information comprises channel information. The updating module may be configured to update the channel information by erasing channel information for the selected data symbols. In such embodiments, the selection model, determination module and updating module are configured for repeatedly selecting a window, determining a likelihood of an error in the window, and updating channel information for selected data symbols of the subset in the window, respectively. The systems described herein may be configured for repeating until a completion condition is met. The completion condition may include performing the updating on one or more data symbols of the plurality of LDPC-encoded data symbols.

BRIEF DESCRIPTION OF THE DRAWINGS

The above and other advantages of the disclosure will be apparent upon consideration of the following detailed description, taken in conjunction with the accompanying drawings, in which like reference characters refer to like parts throughout, and in which.

DETAILED DESCRIPTION

The systems and methods described herein generally relate to detecting errors associated with the communication and/or storage of data. In general, and as will be discussed in more detail below, a "channel" refers to a medium on which a data-bearing signal is communicated and/or stored, as well as events that may physically affect the medium. Various aspects of a channel may corrupt data that is communicated or stored thereon, and the data recovered subsequent to communication or storage may be different from their intended values. Such differences are referred to herein as "errors."

The systems and methods described herein employ data encoding and decoding to mitigate the occurrences of errors in data. "Encoding" generally refers to the process of generating data in a manner that facilitates subsequent detection and/or correction of errors in the data, and "decoding" generally refers to the counterpart process of detecting and/or correcting the errors. Coded information can be grouped into units called "codewords." Codewords may contain "symbols," which are groupings of one or more bits.

In the process of encoding and decoding data, different codes can be used to encode data to achieve different results. One class of codes, called error-correction codes (ECC), may be used to detect and/or correct errors. Error correcting codes are often used to correct errors which may occur during transmission or storage. In the disclosed systems and methods, error correction code-encoded (ECC-encoded) data symbols are processed. These ECC-encoded data symbols are associated with computation units called symbol nodes, which represent the ECC-encoded data symbols within a codeword. One type of ECC is a low-density parity-check (LDPC) code, or Gallager code.

The disclosed systems and methods perform decoding of LDPC coded messages by iteratively passing information between each symbol node and a decoder. This information comprises two types of data: channel information and extrinsic information. Channel information refers to information obtained from one or more channels. Extrinsic information refers to any information obtained outside the context of a channel. This includes information produced by any determinations and/or computations in the course of the execution of the disclosed systems and methods.

Figure 1A:
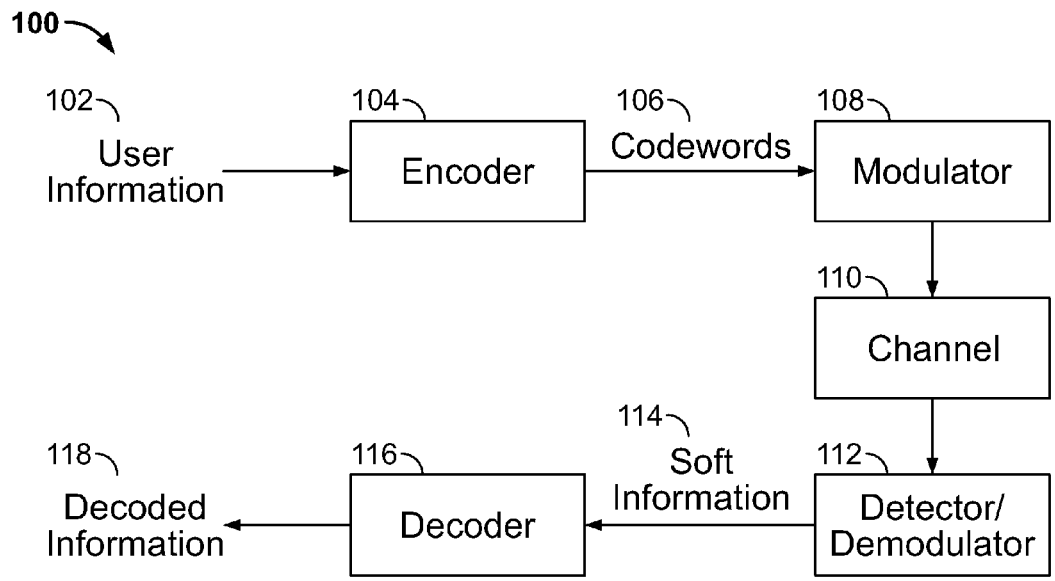
FIG. 1A shows an example of a communication/storage system that implements a method for iterative decoding in a reconfigurable decoder.

FIG. 1A shows an example of a communication/storage system 100 that employs a low density parity check (LDPC) code and implements a method for iterative decoding using a reconfigurable decoder. An LDPC code is a particular type of parity check code in which, generally, there are several parity check constraints and the number of variables in each parity check constraint is relatively small compared to the total number of bits in a codeword. In various implementations, the iterative decoding method may be used in a system which aims to achieve reliable data transfer over a channel using iterative decoding.

User information 102 that is intended for communication/storage can be encoded by encoder 104 to generate coded information/codewords 106. A modulator 108 can configure the codewords 106 into a signal (not shown), which is passed to the channel 110. The modulator 108 can employ a number of modulation techniques known in the art, such as binary phase shift keying (BPSK), for example.

With continuing reference to FIG. 1A, a signal on the channel 110 can be received by a detector/demodulator 112. The detector/demodulator 112 can produce soft information 114 for the coded information represented by the received signal (not shown). As used herein, the term "soft information" refers to information that indicates the likelihood of a symbol value. The soft information 114 commonly includes probability values and log-likelihood ratios (LLRs). Reconfigurable decoder 116 receives the soft information 114 and uses the soft information 114 to attempt to recover the original user information 102. Reconfigurable decoder 116 preferably is a particular type of decoder that uses an iterative decoding technique. Reconfigurable decoder 116 produces decoded information 118, which may or might not include errors. If there are no errors in the decoded information 118, the decoded information 118 will be the same as the user information 102. Otherwise, the decoded information 118 will be different from the user information 102.

As described above, encoder 104 may be an iterative LDPC encoder, or any selected error correction code-encoding scheme. In addition, the reconfigurable decoder 116 may be a corresponding iterative LDPC decoder, or any selected corresponding error correction code-decoding scheme based on iterative decoding.

Figure 1B:
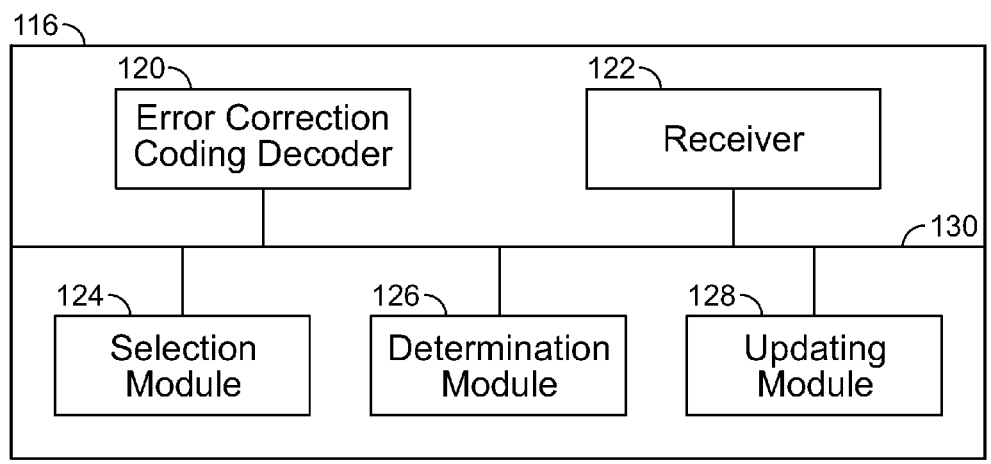
FIG. 1B depicts the reconfigurable decoder of FIG. 1A.

FIG. 1B depicts the reconfigurable decoder 116 of FIG. 1A. Reconfigurable decoder 116 includes an error correction coding (ECC) decoder 120, a receiver 122, a selection module 124, a determination module 126, and an updating module 128, which exchange data through data bus 130. The ECC decoder 120 acquires extrinsic information for the ECC-encoded data symbols. The receiver 122 acquires information for the ECC-encoded data symbols. The selection module 124 selects a subset of ECC-encoded data symbols. The determination module 126 determines information about each data symbol in the subset. The updating module 128 updates information for data symbols in the subset. In various implementations, the ECC-decoder 120 and modules 124, 126, and 128 may include logic, a processor, or machine-readable media.

Figure 2:
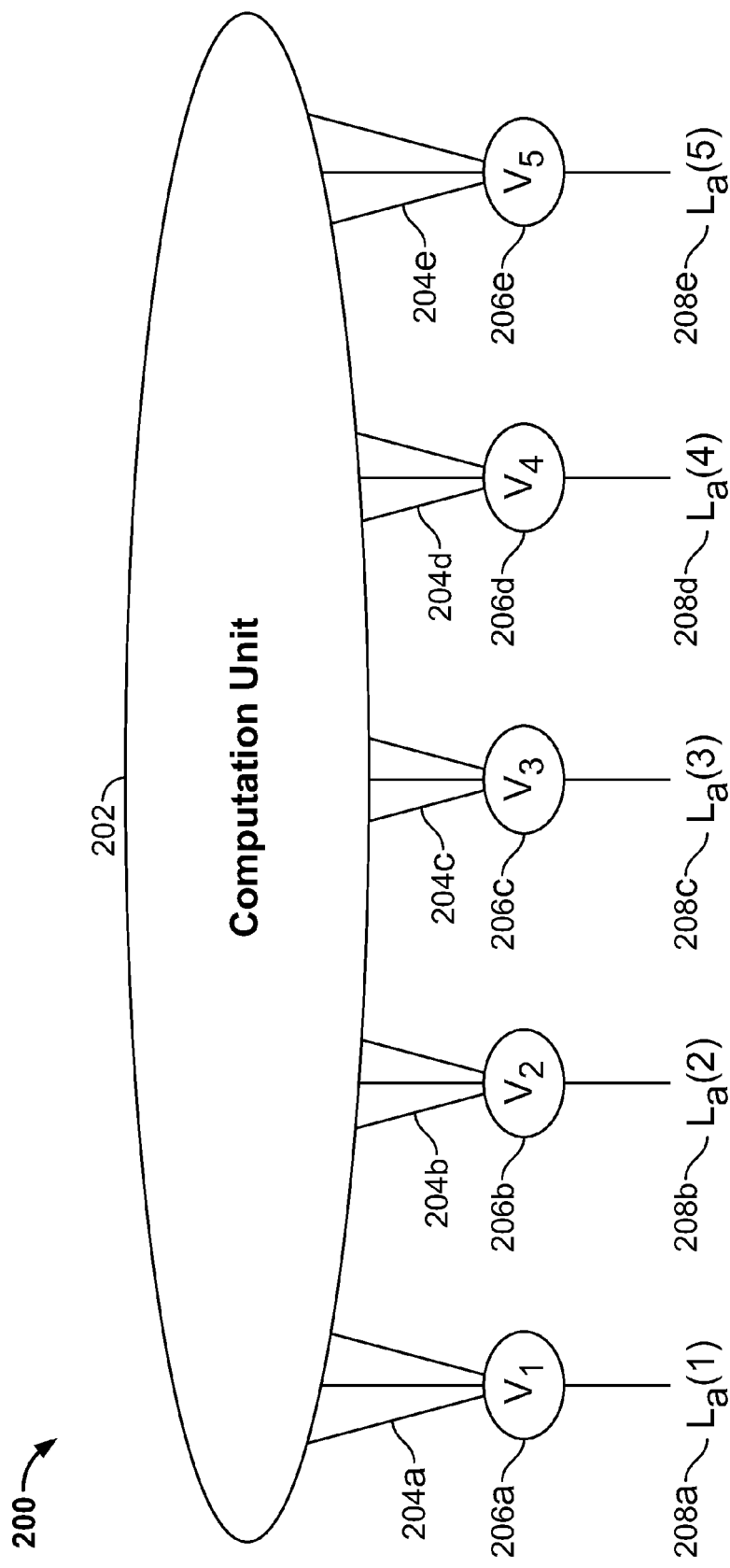
FIG. 2 shows a conceptual diagram of iterative decoding.

FIG. 2 shows a conceptual diagram 200 of iterative decoding, including a computation unit 202, a first set of information 204a-204e, symbol nodes 206a-206e, and a second set of information 208a-208e. The first set of information 204a-204e may be extrinsic information, or any suitable type of information. The second set of information 208a-208e may be channel information, or any suitable type of information. The second set of information 208a-208e is input to corresponding symbol nodes 206a-206e, respectively. The symbol nodes 206a-206e represent the ECC-encoded (e.g., LDPC-encoded) data symbols within a codeword, for example the codeword 106 of FIG. 1A. The second set of information 208a-208e input to the symbol nodes 206a-206e is passed to a computation unit 202. The computation unit 202 preferably uses a selected error correction code encoding structure to process the second set of information 208a-208e from the symbol nodes 206a-206e. After the computation unit 202 receives the second set of information 208a-208e from the symbol nodes 206a-206e, it preferably computes the first set of information 204a-204e for the symbol nodes 206a-206e. According to one embodiment, the computation unit 202 determines the first set of information 204a-204e based on the error correction code by which the data symbols represented by the symbol nodes 206a-206e are encoded. The symbol nodes 206a-206e then use their respective first set of information 204a-204e together with their respective second set of information 208a-208e to create a new first set of information (not shown), which is sent to the computation unit 202. This process may be repeated until one or more stopping conditions are satisfied.

In various embodiments, iterative decoding as represented in diagram 200 may include any selected number of symbol nodes 206a-206e, including 1, 2, 3, 4, 5, 8, 10, 15, 20, 30, 40, 50, 75, 100, 200, 500, 1000 or more than 1000 symbol nodes. Additionally, as described above, the error correction code may be, for example, an LDPC code.

Figure 3A:
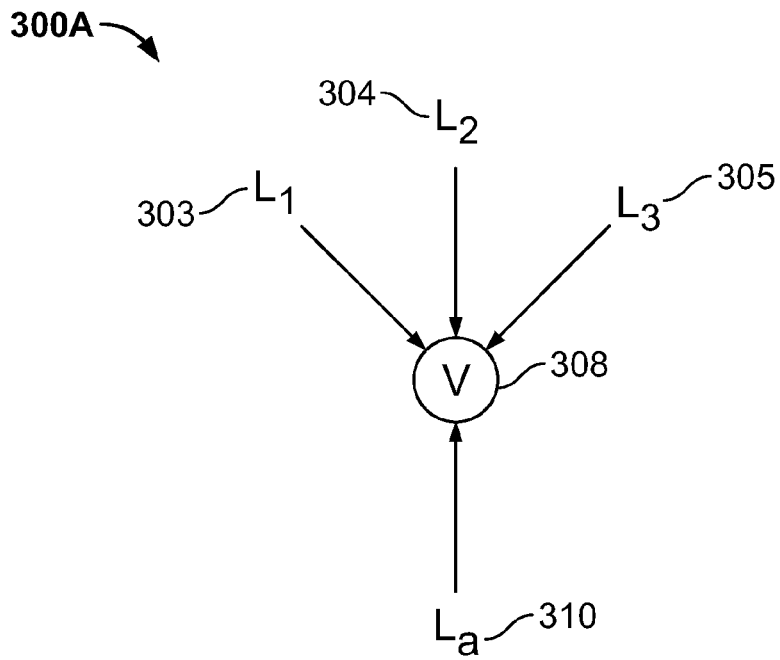
FIG. 3A. shows an enlarged view of a symbol node.

FIG. 3A shows an enlarged view 300A of a symbol node 308, which may be, for example, one of the symbol nodes 206a-206e of FIG. 2. Symbol node 308 represents an ECC-encoded data symbol. The enlarged view 300 also includes extrinsic information 303, 304, and 305 and channel information 310. In various embodiments, extrinsic information 303, 304, and 305 may include any number of extrinsic information, including 1, 2, 3, 4, 5, 6, 7, 8, 10, 12, 15, or more than 15. In various embodiments, channel information 310 may include any number of channel information, including 1, 2, 3, 4, 5, 6, 7, 8, 10, 12, 15, or more than 15. The numbers of extrinsic and channel information may depend on the numeral system used to represent the ECC-encoded data symbol represented by symbol node 308. For example, the numeral system may be binary, ternary, quaternary, or any suitable numeral system.

With reference to FIG. 3A, the extrinsic information 303, 304, and 305 arrives at symbol node 308. The channel information 310 also arrives at symbol node 308. In one embodiment, the extrinsic information 303, 304, and 305 and the channel information 310 include soft information, such as log likelihood ratios (LLRs) and/or probability values. For example, if the ECC-encoded data represented by the symbol node 308 is binary, the extrinsic information 303, 304, and 305 and channel information 310 for the symbol node 308 may be the probability $P(v=1)$ or the probability $P(v=0)$. In another example in which the ECC-encoded data represented by the symbol node 308 is binary, the extrinsic information 303, 304, and 305 and channel information 310 for a symbol node may be the log-likelihood ratio log $$\log\left(\frac{P(v=1)}{P(v=0)}\right).$$

According to one implementation, a positive LLR indicates that the ECC-encoded data represented by symbol node 308 is likely to have the value 1, whereas a negative LLR indicates that the ECC-encoded data represented by symbol node 308 is likely to have the value 0.

In one embodiment in which the ECC-encoded data represented by the symbol node 308 is a binary value, the sign of the extrinsic information 303, 304, and 305 and/or of the channel information 310 indicates the value of the ECC-encoded data represented by the symbol node 308 as described above. For example, a positive sign indicates that the value of the symbol node 308 is 1, while a negative sign indicates that the value of the symbol node 308 is zero. In one example, channel information 310 ($L_a$) equals 3, extrinsic information 303 ($L_1$) equals 4, extrinsic information 304 ($L_2$) equals 1, and extrinsic information 305 ($L_3$) equals −2. In this example the channel information 310 ($L_a$) indicates that the ECC-encoded data represented by symbol node 308 is likely to be 1 since the sign of $L_a$ is positive. Additionally, the overall extrinsic information 303, 304 and 305, defined as $L_e=L_1+L_2+L_3$, indicates that the value of the information of symbol node 308 is likely to be 1, since the sign of $L_e$ is positive. Note that in this example, the channel information 308 and the extrinsic information 303, 304, and 305 is represented as log likelihood ratios.

In another example, $L_a=3$, $L_1=-4$, $L_2=1$, and $L_3=-2$. In this case the channel information 310 ($L_a$) indicates that the value of the information of symbol node 308 is likely to be 1 since the sign of $L_a$ is positive. However, the sign of the overall extrinsic information 303, 304, and 305 is negative, indicating that the value of the information of symbol node 308 is likely to be 0. When the overall extrinsic information 303, 304, and 305 and the channel information 310 each indicate conflicting values for the symbol node 308, then an error may have occurred, and the channel information is updated as described in further detail below with respect to FIG. 4.

Figure 3B:
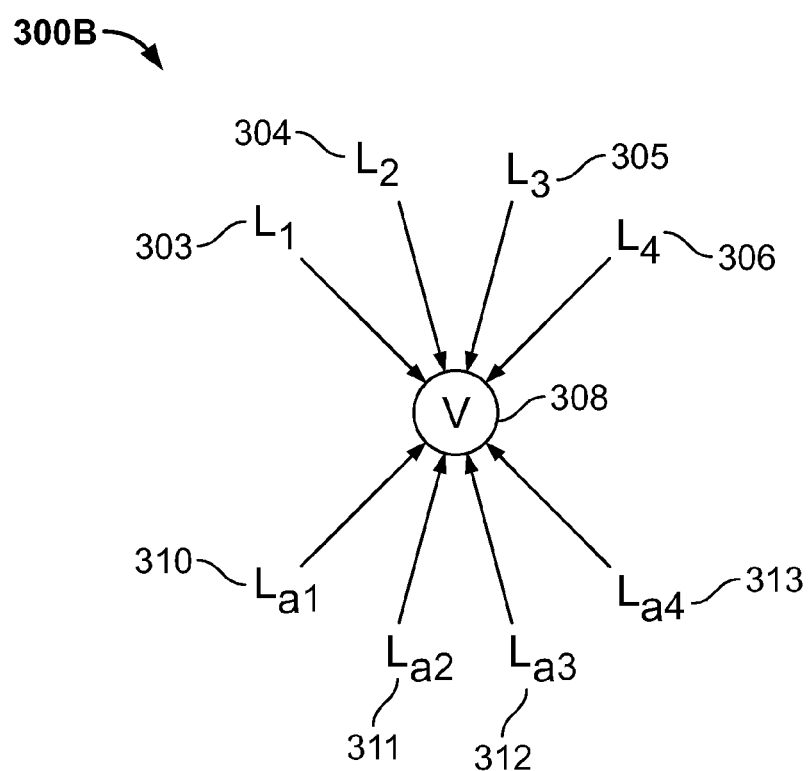
FIG. 3B shows an additional enlarged view of a symbol node.

FIG. 3B shows another enlarged view 300B of the symbol node 308, which may be, for example, one of the symbol nodes 206a-206e of FIG. 2. Symbol node 308 represents an ECC-encoded data symbol. The enlarged view 300 also includes extrinsic information 303, 304, 305, and 306, and channel information 310, 311, 312, and 313. In one example, the ECC-encoded data symbol represented by the symbol node 308 is a quaternary value, and the extrinsic information 303, 304, 305, and 306 and channel information 310, 311, 312, and 313 for the symbol node 308 includes log-likelihood ratios. The extrinsic information 303, 304, 305, and 306 may comprise a first log-likelihood ratio vector having four LLRs, and the channel information 310, 311, 312, and 313 may comprise a second log-likelihood ratio vector having four LLRs. Each log-likelihood ratio vector may have the same structure:

$$L(v) = \left[\log\left(\frac{P(v=0)}{P(v=0)}\right)\log\left(\frac{P(v=1)}{P(v=0)}\right)\log\left(\frac{P(v=2)}{P(v=0)}\right) \text{ and } \log\left(\frac{P(v=3)}{P(v=0)}\right)\right]$$

The LLRs in the log-likelihood ratio vector $L(v)$ may correspond to the quaternary values 0, 1, 2, and 3 respectively. Note that the first entry of the log-likelihood ratio vector $L(v)$ is 0. According to one quaternary implementation, the ECC-encoded data represented by symbol node 308 is likely to have the value corresponding to the largest LLR in the log-likelihood ratio vector. For example, if the fourth entry in the log-likelihood ratio vector for a symbol node is largest, the ECC-encoded data represented by that symbol node is likely to be 3. In other embodiments, other non-binary encoding schemes may be used, and log-likelihood ratio vector $L(v)$ may have any number of elements, including, 2, 3, 4, 5, 6, 7, 8, 10, 12, 15, or more than 15.

Traditionally, in LDPC decoding, a message passing algorithm similar to the type described above is defined in a parity-check matrix that specifies connections between symbol nodes corresponding to the message and symbol nodes corresponding to parity bits. The parity-check matrices typically have dimensions defined by the code rate, or the length of the codeword and the number of parity bits. Typical decoders scan the parity check matrix, column-by-column or row-by-row and determine the direction of flow and content of extrinsic information. These decoders typically allow a user to select from a plurality of code rates. For example, LDPC decoders may contain, in memory, a plurality of parity-check matrices, each corresponding to one of a plurality of code rates. Although the user may, in certain implementations, only select one of the plurality of code rates for further use, the decoder may be storing in memory the plurality of parity-check matrices. Similarly, the decoder may allow a user to select from a one of a plurality of sector sizes (window sizes) in a range of sector sizes. The sector sizes (window sizes) typically relate to the number of bits that are considered at a time for decoding. Accordingly, the iteration of the message passing algorithm depends on the sector size. In such an embodiment where a user can select from one of a plurality of sector sizes, the decoder may be required to iterate the message passing algorithm more times than is necessary, especially when the sector size is smaller than the length of the LDPC code. For these reasons, among others, it may be desirable to provide a reconfigurable decoder 116 capable of allowing a user to customize code in different configurations while maintaining and/or improving the performance of the decoder.

In certain embodiments, the systems and methods described herein include a reconfigurable decoder 116 having hardware and software components configured to support a flexible range of code rates by providing a user with a plurality of decoding schedules, each corresponding to a set of instructions that dictate the hardware function on a cycle-by-cycle basis. In certain embodiments, by including these decoding schedules, the reconfigurable decoder 116 can eliminate the need for the plurality of parity check matrices because hardware functionality of scanning the rows and columns of the parity-check matrix is replaced by specific instructions to the hardware to read and write values from memory.

Figure 4:
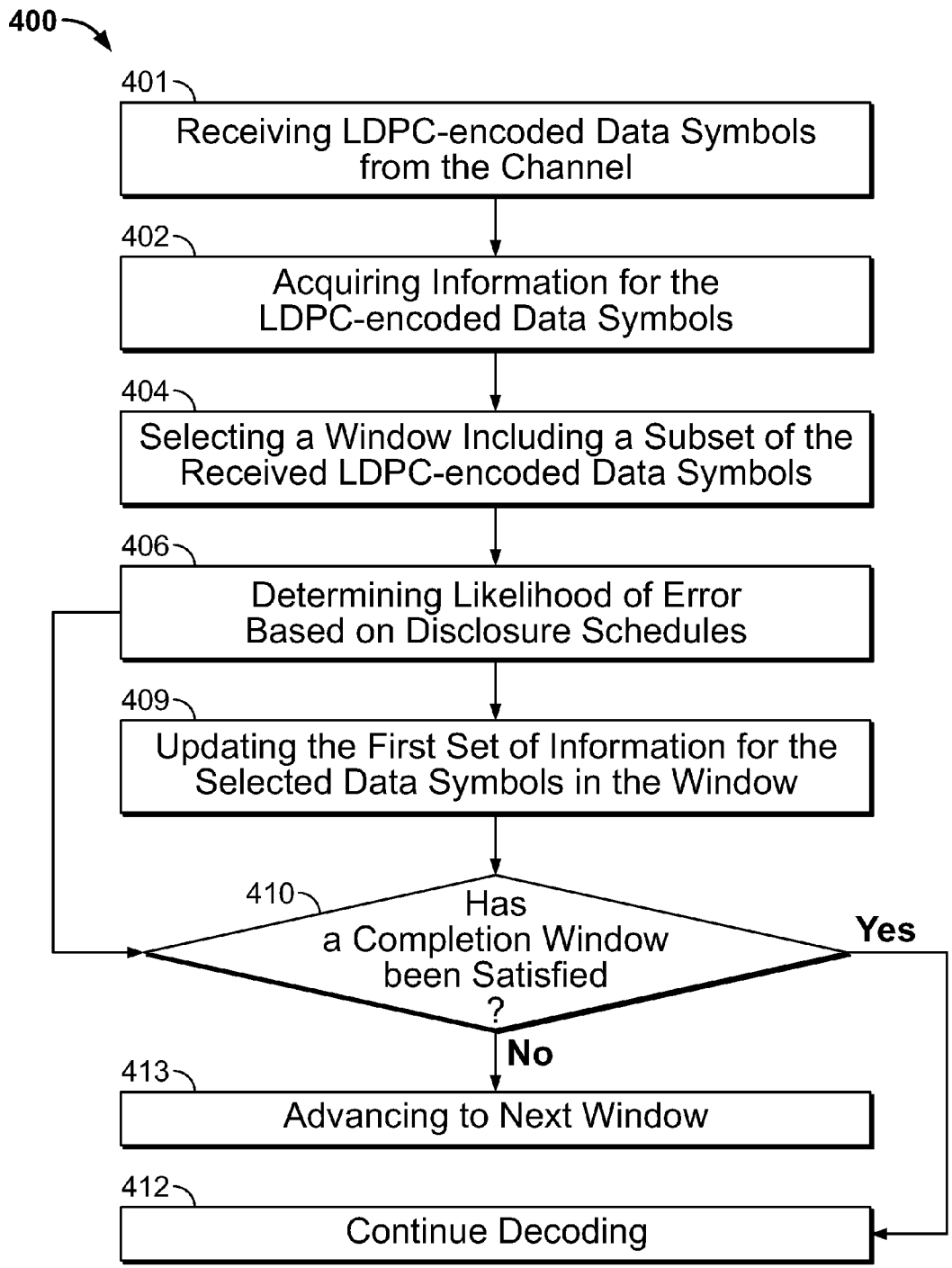
FIG. 4 is a flowchart illustrating a method for iterative decoding by the reconfigurable decoder.

FIG. 4 is a flowchart illustrating a method 400 for iterative decoding in a reconfigurable decoder. At 401 ECC-encoded data symbols are received. At 402, one iteration of iterative decoding is performed to acquire information for the ECC-encoded data symbols. The information may include a first set of information and a second set of information. The first set of information may include extrinsic information and the second set of information may include channel information. At 404, a window is selected including a set of consecutive symbol nodes, which are computation units representative of the ECC-encoded data symbols received at 401. At 406, the likelihood of an error in the window is determined based on soft information incoming to the symbol nodes. The soft information may include the extrinsic information and the channel information, which are substantially the same as the first set of information 204a-204e and the second set of information 208a-208e described in FIG. 2. If it is determined in block 406 that a error is likely to have occurred, then, at 409, the second set of information is updated. The second set of information updated may comprise the channel information. Alternatively, if at 406 it is determined that an error is not likely to have occurred, the method 400 may proceed directly to 410.

At 410, the method 400 includes checking whether a completion condition has been satisfied. According to one example, the completion condition includes processing a plurality of the received ECC-encoded data symbols to determine whether errors are likely to have occurred. If a completion condition has not been satisfied, then a different window is selected, and 406 and 409 are repeated. Alternatively, if the completion condition has been satisfied, the iterative decoding method 400 may proceed to 412. At 412, the decoding process may be continued. In one embodiment, at 412 the decoding process may be restarted with updated information from the previous iterations of the method 400. In another embodiment, at 412 the decoding may be stopped. If the iterative decoding is restarted at 406, the updated information from the previous iterations of the method 400 may be used in further iterations of the method 400.

Additionally, in subsequent iterations, the number of symbol nodes included in the window selected at 413 may remain fixed during subsequent iterations of the method 400, or the number of symbol nodes included in the window may be variable. In one embodiment, the next window is selected by advancing the previous window by a fixed number of symbols. In another embodiment, the next window is selected by moving to a suspicious location where an error may have occurred.

In one implementation of the disclosure, if the completion condition has not been satisfied at 410, the method 400 terminates. Decoding may be continued at a later time at 401 if more error correction code-encoded symbols are received. This implementation may occur when no channel information was updated at 409 over the course of the method 400. In another implementation, the method 400 restarts the decoding by acquiring new channel information at 402.

As described above, at 406 the likelihood of an error in a selected window is determined based on extrinsic and channel information. The determination of the likelihood of an error may rely on "hard decisions" obtained from both the extrinsic information and the channel information. A "hard decision" is a determination of the most likely value for a piece of information. As described above, if it is determined that an error is likely to have occurred in the window, channel information for selected data symbols in the window is updated at 409. This update may include erasing the channel information within the window.

In certain embodiments, the likelihood of an error (block 406) is determined by the reconfigurable decoder 116 by following instructions provided in a decoding schedule. The decoding schedules may include one or more of a selection of controls dictating the hardware function on a cycle-by-cycle basis. In certain embodiments, the decoding schedule includes at least one of controls to enable memory read commands, controls to read memory addresses, controls to enable memory write commands, controls to write to memory addresses, controls to reset processors, controls to reset parity check circuits and controls to evaluate syndrome or enable parity checks. In certain embodiments, the decoding schedules may further include decoder parameters including at least one of code word size and length, range of supported number of parity bits in code, range of supported number of user bits in code, circulant size, number of iterations to decode, number of layers to decode, column weight, and row weight.

In certain embodiments, one or more decoding schedules may include a binary file and stored in a location in non-volatile memory. In certain embodiments, each decoding schedule may be distributed across a plurality of binary files. In certain embodiments, the decoding schedules may be stored in a disk maintenance zone of non-volatile memory. The decoding schedules may be stored in embedded flash or external flash memory. Generally, the decoding schedules may be stored in any memory device and in any file format without departing from the scope of the systems and methods described herein. In certain embodiments, the decoding schedules may be encrypted and CRC protected. In such embodiments, decryption and CRC check may be performed when the decoding schedules are programmed.

The reconfigurable decoder 116 may include one or more software components for programming and/or creating one or more decoding schedules. In certain embodiments, software is separate from the reconfigurable decoder 116 may be used to program and/or create one or more decoding schedules. The software components used to create and program a decoding schedule may include at least one of software instructions for initializing a programming interface (e.g., flash programming interface), initializing the memory and writing data into the memory. In certain embodiments the sequence of instructions in the decoding schedule may be depend on the sequence of data written into memory.

The one or more decoding schedules provide the reconfigurable decoder 116 with instructions for parsing through parity-check matrices. In certain embodiments, the decoding schedules may be generated in software based on a desired parity-check matrix, which in turn may be based on configuration of a desired LDPC code. A user, using a software tool, may be able to generate a decoding schedule, based on desired code configurations and corresponding parity check matrices and then provide the decoding schedule to the reconfigurable decoder 116 hardware. The reconfigurable decoder 116 hardware processor may then process the instructions contained in the decoding schedules and decode a codeword.

The systems and methods described herein advantageously provide the hardware of the reconfigurable decoder with specific instructions for decoding a codeword, without having to store large parity-check matrices, which can take up large amounts of memory, and without having to parse through large parity-check matrices, which can be time-consuming.

The foregoing describes systems and methods for improving the LDPC decoding capability of iterative decoders. One skilled in the art will appreciate that the systems and methods described herein can be practiced by other than the described embodiments, which are presented for purposes of illustration and not of limitation, and the present disclosure is limited only by the claims that follow.

What is claimed is:

1. A method for decoding data, the method comprising:
   acquiring, at a decoder device, first information and second information for a low density parity check (LDPC)-encoded data symbol;
   acquiring a decoder schedule, wherein the decoder schedule includes decoding instructions based on a configuration of at least one of the first information and the second information;
   determining an error parameter for the LDPC-encoded data symbol based on the decoding instructions; and
   updating the second information based on the error parameter.

2. The method of claim 1, wherein the first information comprises extrinsic information, and the second information comprises channel information.

3. The method of claim 2, wherein updating the second information comprises erasing the channel information for the LDPC-encoded data symbol.

4. The method of claim 2, further comprises:
   selecting a window, wherein the window comprises a subset of a plurality of LDPC-encoded data symbols, and wherein the LDPC-encoded data symbol is a symbol of the plurality of LDPC-encoded data symbols;
   determining a window error parameter; and
   updating channel information for a selected LDPC-encoded data symbol of the window.

5. The method of claim 4, wherein the steps of claim 4, are repeated until a completion condition is met.

6. The method of claim 5, wherein the completion condition includes performing the updating on each LDPC-encoded symbol of the plurality of LDPC-encoded data symbols.

7. The method of claim 1, wherein the decoding instructions comprise instructions for functions of the decoder on a cycle-by-cycle basis.

8. The method of claim 1, wherein the decoder schedule comprises at least one of controls to enable memory read commands, controls to read memory addresses, controls to enable memory write commands, controls to write to memory addresses, controls to reset processors, controls to reset parity check circuits, controls to enable parity checks, and controls to insert stalls in a processing pipeline.

9. The method of claim 1, wherein the decoder schedule includes decoder parameters including at least one of code word size and length, range of supported number of parity bits in code, range of supported number of user bits in code, circulant size, number of iterations to decode, number of layers to decode, column weight, and row weight.

10. The method of claim 1, further comprising selecting a window including a subset of a plurality of LDPC-encoded data symbols.

11. A system for decoding data, the system comprising:
a reconfigurable low-density parity check (LDPC) decoder configured to acquire first information and second information for a LDPC-encoded data symbol;
a storage module configured to acquire a decoder schedule, wherein the decoder schedule includes decoding instructions based on a configuration of at least one of the first information and the second information;
a determination module configured to determine an error parameter for the LDPC-encoded data symbol based on the decoding instructions; and
an updating module configured to update the second information based on the error parameter.

12. The system of claim 11, wherein the decoding instructions comprise instructions for functions of the decoder on a cycle-by-cycle basis.

13. The system of claim 11, wherein the decoder schedule comprises at least one of controls to enable memory read commands, controls to read memory addresses, controls to enable memory write commands, controls to write to memory addresses, controls to reset processors, controls to reset parity check circuits, controls to enable parity checks, and controls to insert stalls in a processing pipeline.

14. The system of claim 11, wherein the decoder schedule comprises decoder parameters including at least one of code word size and length, range of supported number of parity bits in code, range of supported number of user bits in code, circulant size, number of iterations to decode, number of layers to decode, column weight, and row weight.

15. The system of claim 11, wherein the decoding instructions are based on a parity-check matrix corresponding to a configuration of at least one of the first information and the second information.

16. The system of claim 11, wherein the first information comprises extrinsic information, and the second information comprises channel information.

17. The system of claim 16, wherein updating channel information comprises erasing the channel information for the LDPC-encoded data symbol.

18. The system of claim 11, further comprising a selection module configured to select a window including a subset of a plurality of LDPC-encoded data symbols.

19. The system of claim 18, wherein the selection module, the determination module, and the updating module are configured for repeatedly selecting a new window, determining an error parameter corresponding to the window, and updating channel information for selected data symbols of a subset of a plurality of LDPC-encoded data symbols corresponding to the window, until a completion parameter is met.

20. A method for decoding data using a programmable low density parity check (LDPC) decoder, the method comprising:
acquiring a first set of information and a second set of information for a plurality of LDPC-encoded data symbols;
acquiring a decoder schedule, wherein the decoder schedule includes decoding instructions corresponding to a desired code rate;
determining a likelihood of an error for an LDPC-encoded data symbol of the plurality of LDPC-encoded data symbols based on the decoding instructions; and
updating the second information based on the determined likelihood of the error.

21. The method of claim 20, wherein the programmable LDPC decoder supports out-of-order processing of data.

22. The method of claim 20, wherein the decoder schedule is stored in non-volatile memory.

* * * * *